United States Patent
Greene et al.

(10) Patent No.: US 10,586,706 B2
(45) Date of Patent: *Mar. 10, 2020

(54) GATE CUT WITH HIGH SELECTIVITY TO PRESERVE INTERLEVEL DIELECTRIC LAYER

(71) Applicant: INTERNATIONAL BUSINESS MACHINES CORPORATION, Armonk, NY (US)

(72) Inventors: Andrew M. Greene, Albany, NY (US); Ryan O. Jung, Glenmont, NY (US); Ruilong Xie, Niskayuna, NY (US)

(73) Assignees: INTERNATIONAL BUSINESS MACHINES CORPORATION, Armonk, NY (US); GLOBALFOUNDRIES INC, Grand Cayman (KY)

(*) Notice: Subject to any disclaimer, the term of this patent is extended or adjusted under 35 U.S.C. 154(b) by 0 days.

This patent is subject to a terminal disclaimer.

(21) Appl. No.: 16/013,214

(22) Filed: Jun. 20, 2018

(65) Prior Publication Data

US 2018/0315606 A1    Nov. 1, 2018

Related U.S. Application Data

(63) Continuation of application No. 15/484,173, filed on Apr. 11, 2017, which is a continuation of application
(Continued)

(51) Int. Cl.
| | |
|---|---|
| H01L 21/336 | (2006.01) |
| H01L 21/283 | (2006.01) |
| H01L 29/66 | (2006.01) |
| H01L 21/28 | (2006.01) |

(Continued)

(52) U.S. Cl.
CPC ........ H01L 21/283 (2013.01); H01L 21/0332 (2013.01); H01L 21/28017 (2013.01);
(Continued)

(58) Field of Classification Search
USPC ......................................................... 438/296
See application file for complete search history.

(56) References Cited

U.S. PATENT DOCUMENTS

| | | |
|---|---|---|
| 6,027,861 A | 2/2000 | Yu et al. |
| 6,107,686 A | 8/2000 | Sandhu et al. |

(Continued)

OTHER PUBLICATIONS

List of IBM Patents or Patent Applications Treated as Related dated Jun. 20, 2018, 2 pages.

(Continued)

*Primary Examiner* — Caleb E Henry
(74) *Attorney, Agent, or Firm* — Tutunjian & Bitetto, P.C.; Vazken Alexanian

(57) ABSTRACT

A method for preserving interlevel dielectric in a gate cut region includes recessing a dielectric fill to expose cap layers of gate structures formed in a device region and in a cut region and forming a liner in the recess on top of the recessed dielectric fill. The liner includes a material to provide etch selectivity to protect the dielectric fill. The gate structures in the cut region are recessed to form a gate recess using the liner to protect the dielectric fill from etching. A gate material is removed from within the gate structure using the liner to protect the dielectric fill from etching. A dielectric gap fill is formed to replace the gate material and to fill the gate recess in the cut region.

18 Claims, 9 Drawing Sheets

Related U.S. Application Data

No. 15/156,651, filed on May 17, 2016, now Pat. No. 9,837,276, which is a continuation of application No. 14/799,297, filed on Jul. 14, 2015, now Pat. No. 9,659,786.

(51) Int. Cl.
  H01L 21/311 (2006.01)
  H01L 27/02 (2006.01)
  H01L 21/033 (2006.01)
  H01L 21/3105 (2006.01)

(52) U.S. Cl.
  CPC .. *H01L 21/31053* (2013.01); *H01L 21/31111* (2013.01); *H01L 21/31144* (2013.01); *H01L 27/0207* (2013.01); *H01L 29/66545* (2013.01); *H01L 29/66553* (2013.01); *H01L 29/6653* (2013.01)

(56) References Cited

U.S. PATENT DOCUMENTS

| | | |
|---|---|---|
| 6,787,476 B1 | 9/2004 | Dakshina-Murthy et al. |
| 6,921,711 B2 | 7/2005 | Cabral, Jr. et al. |
| 8,389,359 B2 | 3/2013 | Teo et al. |
| 8,546,208 B2 | 10/2013 | Anderson et al. |
| 8,569,152 B1 | 10/2013 | Basker et al. |
| 8,617,996 B1 | 12/2013 | Chi et al. |
| 8,753,940 B1 | 6/2014 | Wei et al. |
| 9,064,932 B1* | 6/2015 | Pham ............. H01L 21/823437 |
| 9,312,136 B2 | 4/2016 | Ando et al. |
| 2013/0049125 A1* | 2/2013 | Zhong ............. H01L 21/823431 257/368 |
| 2014/0110817 A1 | 4/2014 | Bergendahl et al. |
| 2014/0199836 A1 | 7/2014 | Chen et al. |
| 2014/0256144 A1 | 9/2014 | Lo et al. |
| 2015/0187594 A1* | 7/2015 | Tu .................... H01L 21/31055 257/392 |

OTHER PUBLICATIONS

Basker, V.S., et al., "A 0.063 μm2 FinFET SRAM cell demonstration with conventional lithography using a novel integration scheme with aggressively scaled fin and gate pitch," Symposium on VLSI Technology (VLSIT), Jun. 2010. (pp. 1-2).

* cited by examiner

GATE CUT WITH HIGH SELECTIVITY TO PRESERVE INTERLEVEL DIELECTRIC LAYER

BACKGROUND

Technical Field

The present invention relates to semiconductor processing, and more particularly to methods and devices having an improved gate line end that avoids shorts between epitaxy structures and between contacts/silicide regions.

Description of the Related Art

One commonly employed technique for forming gate structures involves forming a line-type gate electrode structure above a layer of insulating material that is formed above an active region defined in a semiconductor substrate. Typically, the line-type gate electrode structures are formed by defining long parallel line-type structures, i.e., gate electrode structures that extend across multiple spaced-apart active regions and the isolation regions formed in the substrate between such spaced-apart active regions. At some point later in the process flow, these long, line-type gate electrode structures are subsequently "cut" by performing an etching process to define the gate electrodes having the desired length in the "gate-width" direction of the transistor device. This results in substantially rectangular shaped gate structures (when viewed from above) having the desired dimensions in the gate-length and gate width directions.

After the gate electrodes are patterned, a sidewall spacer is typically formed around the perimeter of the substantially rectangular shaped gate structure, i.e., the spacer if formed adjacent on all four side sidewalls (two sidewalls and two end surfaces) of each of the patterned gate electrodes. In some cases, a thin liner layer may be formed on the gate structure prior to forming the sidewall spacer. The sidewall spacer, in combination with the gate cap layer, function to protect the gate electrode structure in subsequent processing operations.

In the case where transistor devices are manufactured using so-called gate-first processing techniques, the gate structures (gate electrode plus the gate insulation layer) formed as described above are final gate structures for the device. In the situation where transistor devices are manufactured using so-called gate-last processing techniques, the gate structures (gate electrode and gate insulation layer) formed as described above are sacrificial in nature and will be subsequently removed (after several process operations are performed) and replaced with a final gate structure for the device. In the gate-last processing technique, the final gate structure typically includes one or more layers of high-k insulating material and one or more layers of metal that constitute at least part of the conductive gate electrode of the final gate structure.

Unfortunately, as device dimensions have decreased and packing densities have increased, it is more likely that, when epi semiconductor material is formed in the source/drain regions, some of the epi material may undesirably form on the end surfaces of the polysilicon/amorphous silicon gate electrode. This may occur for several reasons. As noted above, after the gate structures are patterned, a sidewall spacer is formed around all four sides of the gate structure so as to, along with the gate cap layer, encapsulate and protect the gate electrode during subsequent processing operations. As packing densities have increased, the end-to-end spacing between two different gate electrode structures formed above two different active regions has decreased, thereby limiting the physical size, i.e., the width, of the protective sidewall spacers. Additionally, as the pitch between adjacent gate structures has decreased, the width of the protective sidewall spacers must also be decreased.

With respect to forming a sidewall spacer on a device, the duration of the etching process performed to form the spacer is typically increased to ensure that the layer of spacer material is completely cleared from the surfaces of the source/drain regions of the device. This over-etching also tends to reduce the width of the protective spacer. All of these factors and others tend to result in an undesirable thinning of the spacer, particularly at the corner of the gate electrode (the intersection between the side surfaces and the end surfaces of the gate electrode). It is not uncommon that, due to these factors and others, some portion of the polysilicon or amorphous silicon gate electrode material will be exposed at the time epi semiconductor material is formed in the source/drain regions of a planar or FinFET device. As a result, epi semiconductor material will undesirably form on the exposed portions of the gate electrode layer.

The extent and amount of undesirable epi semiconductor material formation will vary depending upon the particular application and the quality of the manufacturing processes used to manufacture the device. In a worst case scenario, this undesirable epi semiconductor material may form around the entire end surface of a particular gate electrode so as to effectively from a conductive "bridge" between one or both of the source/drain regions and the gate electrode. In another example, such undesirable epi semiconductor material may span the space between the opposing end surfaces of two spaced-apart gate electrode structures, wherein the epi material may form on one or both of the spaced-apart gate structures. As a result of such undesirable and unpredictable epi formation, the resulting semiconductor devices and the integrated circuits including such devices may completely fail or operate at less than acceptable performance levels.

SUMMARY

A method for preserving interlevel dielectric in a gate cut region includes recessing a dielectric fill to expose cap layers of gate structures formed in a device region and in a cut region and forming a liner in the recess on top of the recessed dielectric fill. The liner includes a material to provide etch selectivity to protect the dielectric fill. The gate structures in the cut region are recessed to form a gate recess using the liner to protect the dielectric fill from etching. A gate material is removed from within the gate structure using the liner to protect the dielectric fill from etching. A dielectric gap fill is formed to replace the gate material and to fill the gate recess in the cut region.

Another method for preserving interlevel dielectric in a cut region includes forming gate structures in a device region and a cut region; forming source and drain regions in the device region; depositing and planarizing a dielectric fill to fill in gaps between gate structures in the device region and the cut region; recessing the dielectric fill to expose a cap layer at a top portion of the gate structures; forming a liner in the recess on top of the recessed dielectric fill, the liner including a material to provide etch selectivity to protect the dielectric fill; recessing the gate structures in the cut region to form a gate recess using the liner to protect the dielectric fill from being etched; removing a gate material from within the gate structure using the liner to protect the dielectric fill from being etched; and forming a dielectric gap fill to replace the gate material and to fill the gate recess in the cut region.

Yet another method for preserving interlevel dielectric in a cut region includes forming gate structures in a device region and a cut region, the gate structures including a cap layer and spacer layers and a gate material disposed between the spacer layers; forming source and drain regions in the device region; depositing and planarizing a dielectric fill to fill in gaps between gate structures in the device region and the cut region; recessing the dielectric fill to expose the cap layer at a top portion of the gate structures; forming a liner in the recess on top of the recessed dielectric fill by conformally depositing the liner over the gate structures and on the top of the recessed dielectric fill, and planarizing the liner to remove the liner over the gate structures, the liner including a material to provide etch selectivity to protect the dielectric fill; recessing the gate structures in the cut region to form a gate recess using the liner to protect the dielectric fill from being etched by patterning a mask layer to protect the device region and etching the cap layer of the gate structure in the cut region; removing the gate material from within the gate structure using the liner to protect the dielectric fill from being etched; and forming a dielectric gap fill to replace the gate material between the spacers of the gate structures and to fill the gate recess in the cut region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
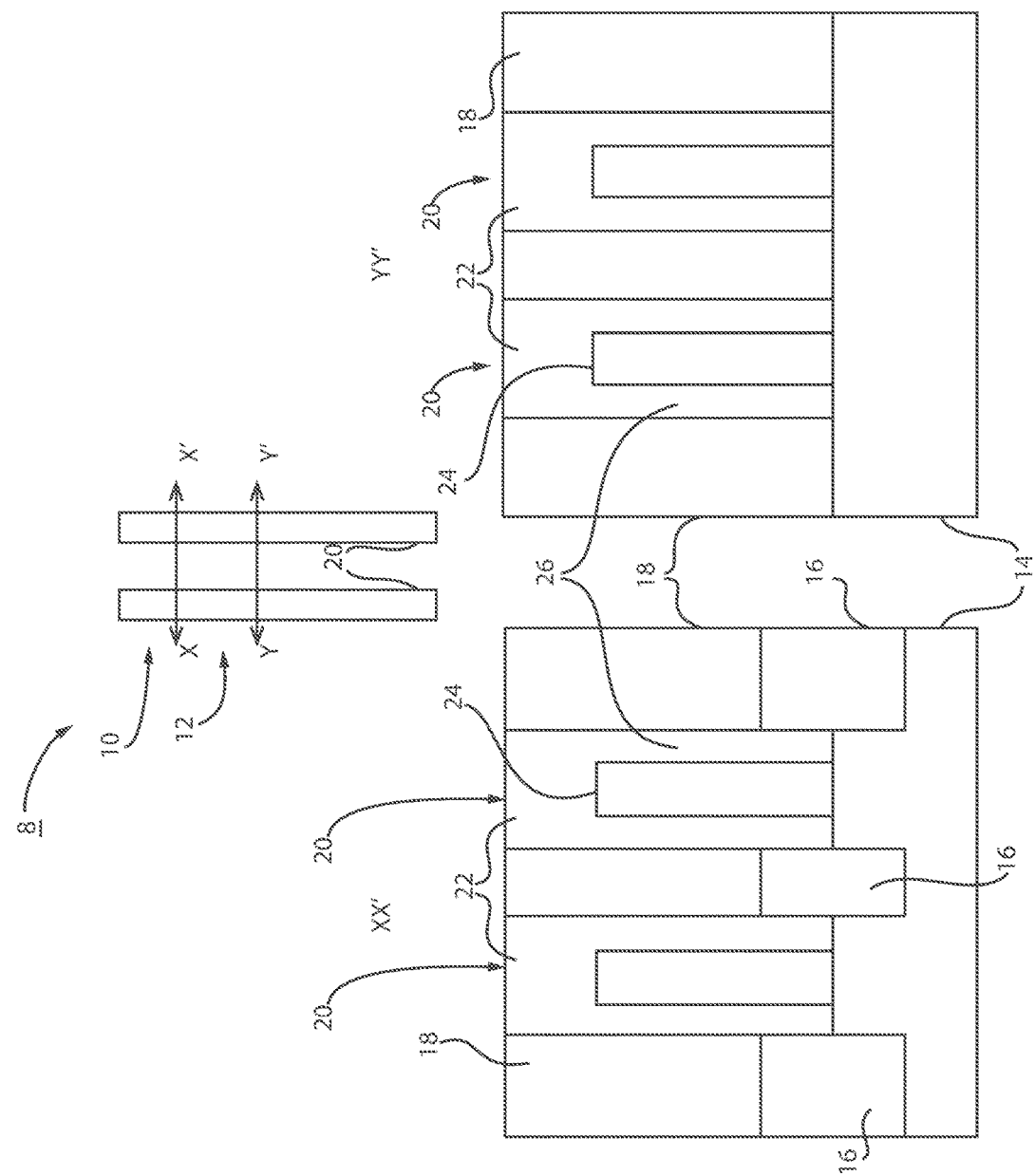
FIG. 1 is a cross-sectional view of a semiconductor device showing a schematic top view and two cross-sectional views depicting a deposition and planarization of a flowable dielectric layer in accordance with the present principles.

In accordance with the present principles, devices and methods are provided for improvements in gate line end processing. In useful embodiments, structures are provided to assist in improving selectivity to preserve interlevel dielectric (ILD) material during gate formation. In one example, a dummy gate structure includes, e.g., polysilicon, which needs to be removed by etching. During this etch, conventional devices experience higher ILD losses in a gate cut region. The gate cut region is a peripheral non-functioning region of the semiconductor device. The cut region does not include source and drain regions and is processed using a cut mask to terminate conductive material outside of a device area or region to ensure that no shorts or other defects impact device operation.

In some instances, ILD in the cut region can be reduced more rapidly by etching. For example, in opening a gate structure to remove the dummy material, the ILD may lose 10 nm or so more than in the device region. In addition, 25 nm or so may be lost from the ILD after the dummy gate material is removed, which is a significant loss considering an oxide thickness of between about 100 nm to about 150 nm. In accordance with the present principles, liners and other structures are incorporated into the workflow to ensure the preservation of the ILD during etching. The present principles are directed to various methods and structures for eliminating or at least reducing line end (cut region) ILD loss.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements, FIGS. 1-8 each includes an illustrative top view 8 which includes a section line XX' through a polysilicon contact replacement gate (PC) region 10 (or device region) and a section line YY' through a cut region 12. Cross-sectional views at each of XX' and YY' are shown in each of FIGS. 1-8. It should be understood that the device region 10 may also include gate first gate structures 20 instead of or in addition to dummy gate structures.

Referring to FIG. 1, the cross-sections taken at section lines XX' and YY' are depicted after a flowable dielectric 18 is deposited and planarized using, e.g., a chemical mechanical polish (CMP) process. The flowable dielectric 18 may include a flowable oxide. The flowable dielectric 18 may form or be part of an interlevel dielectric (ILD).

Gate structures 20 may include dummy gate structures or completed gate structures (for gate-first designs). For dummy gate structures, a gate material 24 includes polysilicon or amorphous silicon. For gate first structures, the gate material includes a gate dielectric (e.g., high-k material) and a gate conductor (e.g., metal, such as W). The gate structures 20 in the PC region 10 include source and drain (S/D) regions 16, which are formed on a semiconductor substrate 14 by epitaxial growth processing. The gate structure 20 extends into the cut region 12 where there are no S/D regions 16. The gate structures 20 include a cap layer 22 and spacers 26. The cap layer 22 and spacers 26 may include a silicon nitride material.

Figure 2:
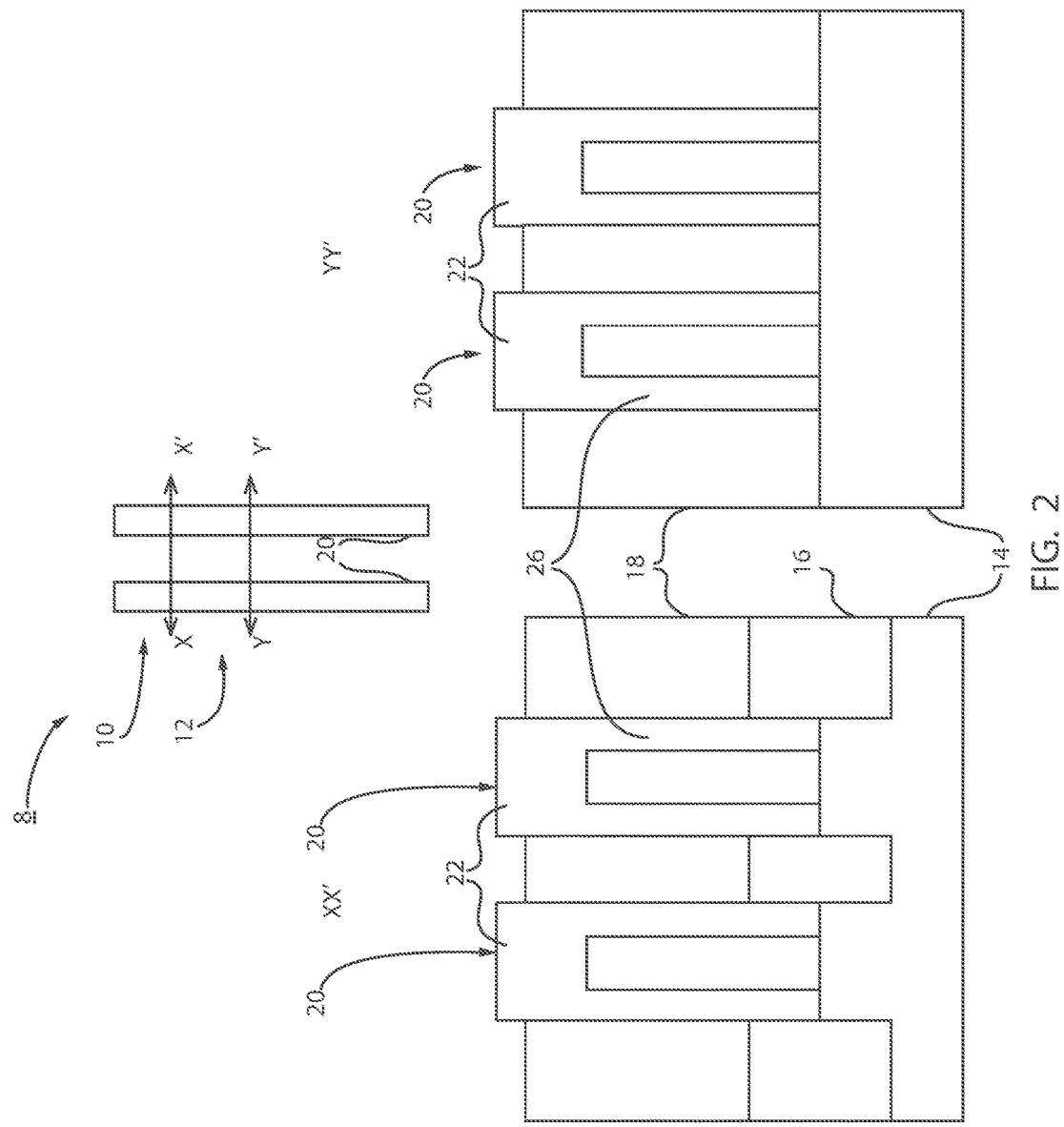
FIG. 2 is a cross-sectional view of the semiconductor device of FIG. 1 showing a schematic top view and two cross-sectional views depicting a recessing of the flowable dielectric layer in accordance with the present principles.

Referring to FIG. 2, the flowable dielectric layer 18 is recessed to expose portions of the cap layer 22 and/or spacers 26 of the gate structures 20. The recess etch may be performed by selectively etching the flowable dielectric 18 with respect to the spacers 26 and cap layer 22 (e.g., selectively etch oxide with respect to nitride in the spacers 26 and cap layer 22).

Figure 3:
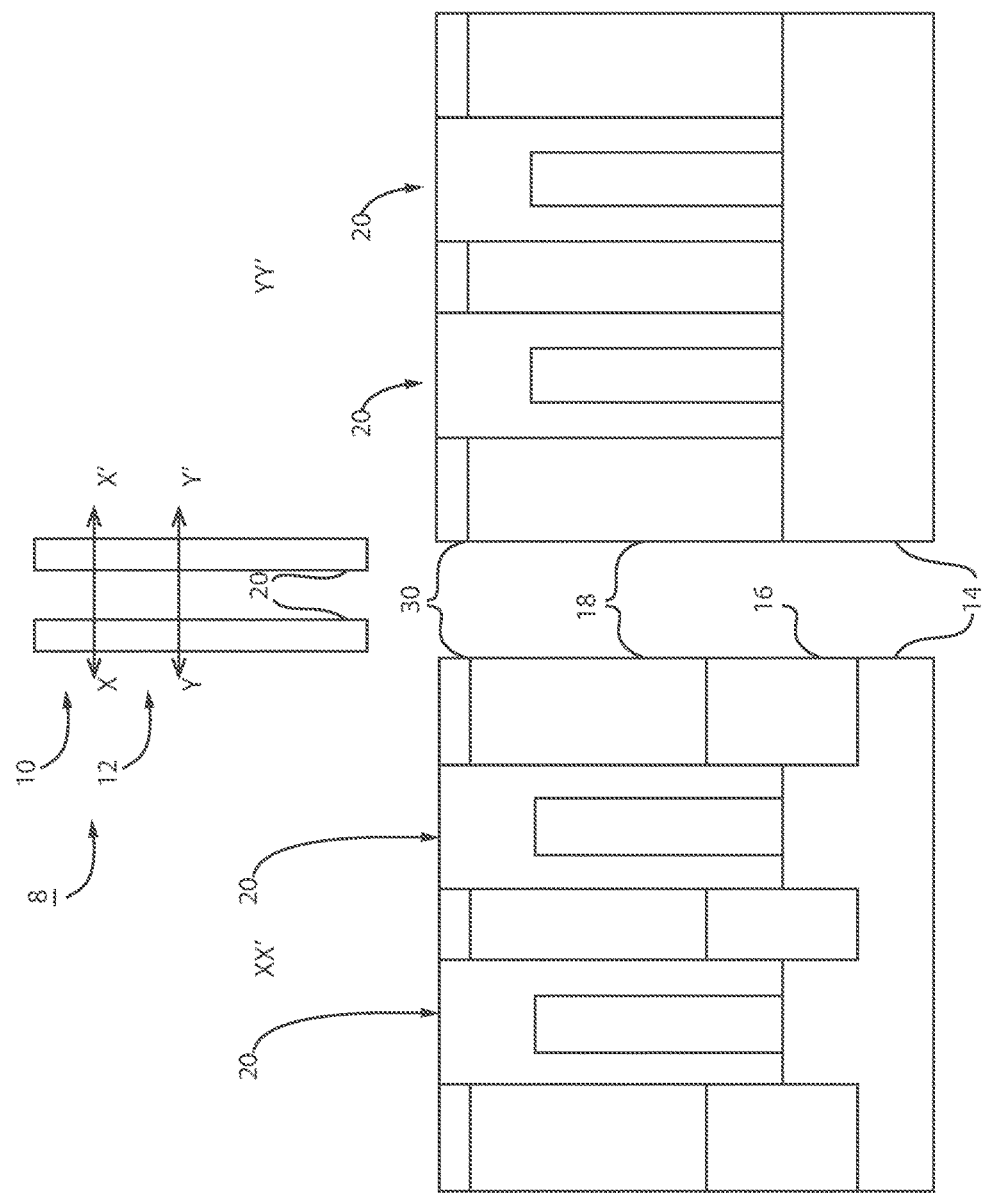
FIG. 3 is a cross-sectional view of the semiconductor device of FIG. 2 showing a schematic top view and two cross-sectional views depicting formation of a etch protecting liner on the flowable dielectric layer in accordance with the present principles.

Referring to FIG. 3, a liner 30 is deposited over a top surface and forms the in the recess created by recessing the dielectric 18. The liner 30 is removed from over the gate structures 20 by performing a CMP process or the like. The liner 30 may include, e.g., TiN, although other materials may be employed. Examples of other liner materials include, e.g., TaN, $Al_2O_3$, etc. The liner 30 includes a high etch resistance (selectivity) to assist in protecting the flowable dielectric 18 during later process steps, such as, e.g., cap removal, a dummy gate replacement etch, etc. The liner thickness need only be a few nanometers in thickness. In one embodiment, the liner 30 includes a thickness of between about 3 nm to about 12 nm, and more preferably between about 5 nm to about 8 nm.

Figure 4:
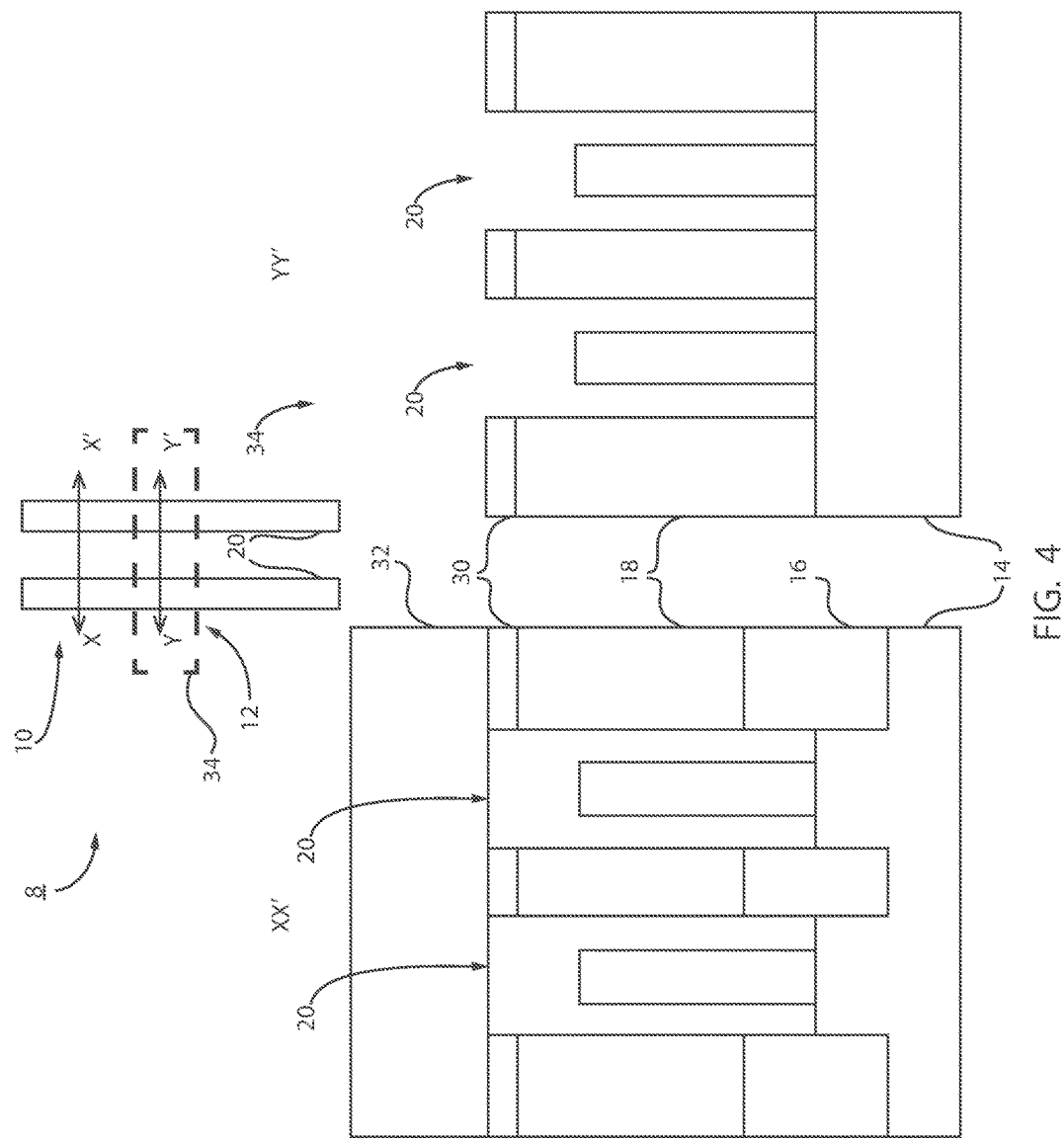
FIG. 4 is a cross-sectional view of the semiconductor device of FIG. 3 showing a schematic top view and two cross-sectional views depicting formation of a cut opening for processing structures with a cut region in accordance with the present principles.

Referring to FIG. 4, an organic planarizing (or patterning) layer (OPL) 32 (or organic dielectric layer (ODL)) is deposited over a top surface of the device on the liner 30 and over the gate structures 20. The OPL 32 is patterned using a cut mask (CT) to form an opening 34 in the OPL 32 in the cut region 12. The OPL 32 may include a photo-sensitive organic polymer comprising a light-sensitive material that, when exposed to electromagnetic (EM) radiation, is chemically altered and thus configured by the cut mask (not shown) to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, poly(methyl methacrylate) or benzocyclobutene (BCB).

Figure 5:
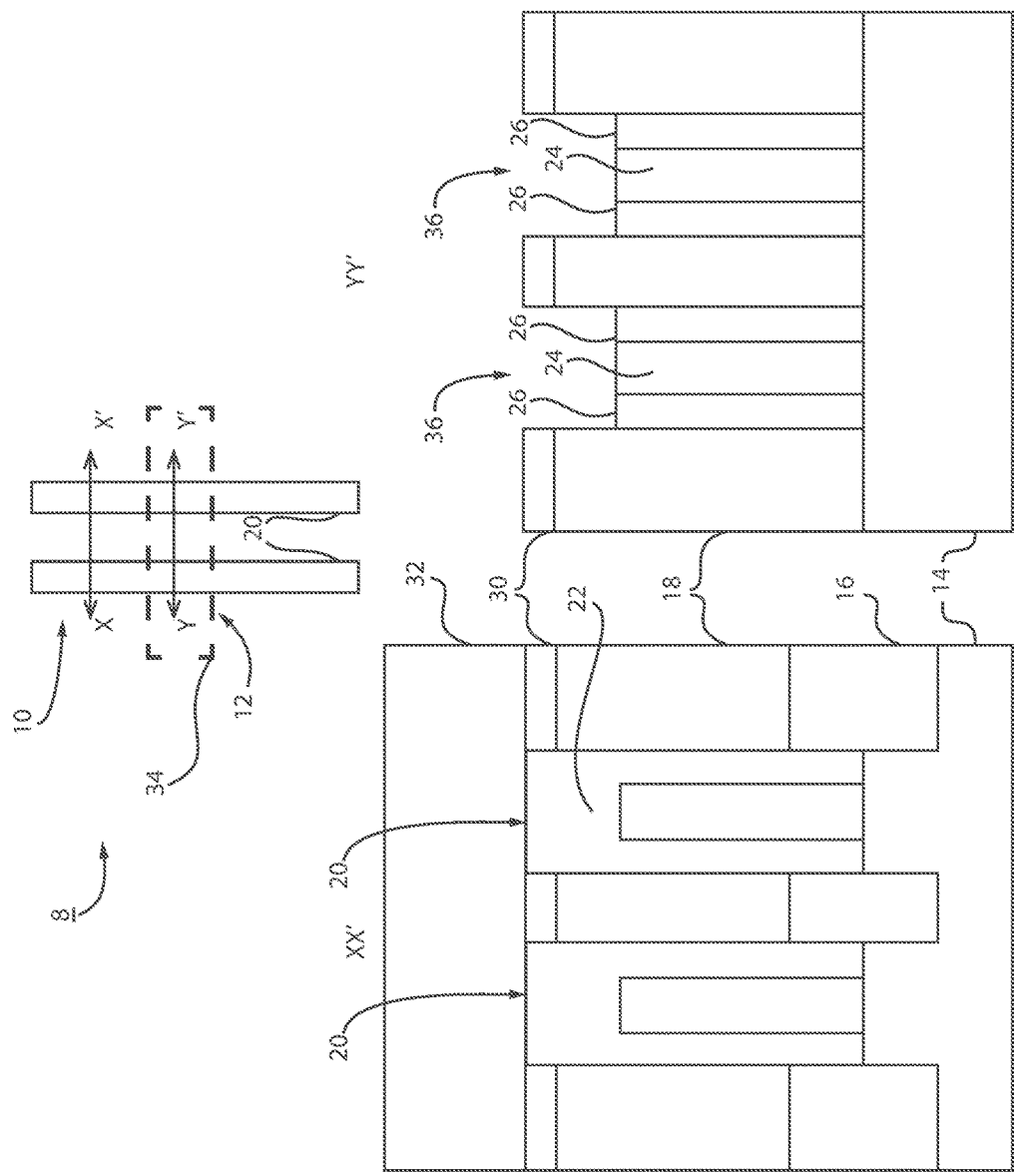
FIG. 5 is a cross-sectional view of the semiconductor device of FIG. 4 showing a schematic top view and two cross-sectional views depicting a cap layer for gate structures in the cut region being recessed in accordance with the present principles.

Referring to FIG. 5, the OPL 32 is employed as an etch mask to form recesses 36 in the gate structures 20 in the cut region 12. The liner 30 is highly resistant to this etch process. In one embodiment, the cap layer 22 of the gate structures 20 in the cut region 12 is removed. In one example, the cap layer 22 includes SiN which is selectively etched with respect to the flowable dielectric 18 and the liner 30. The liner 30 may include TiN which protects the top surface of the flowable dielectric 18 very well when etching the SiN of the cap layer 22.

Figure 6:
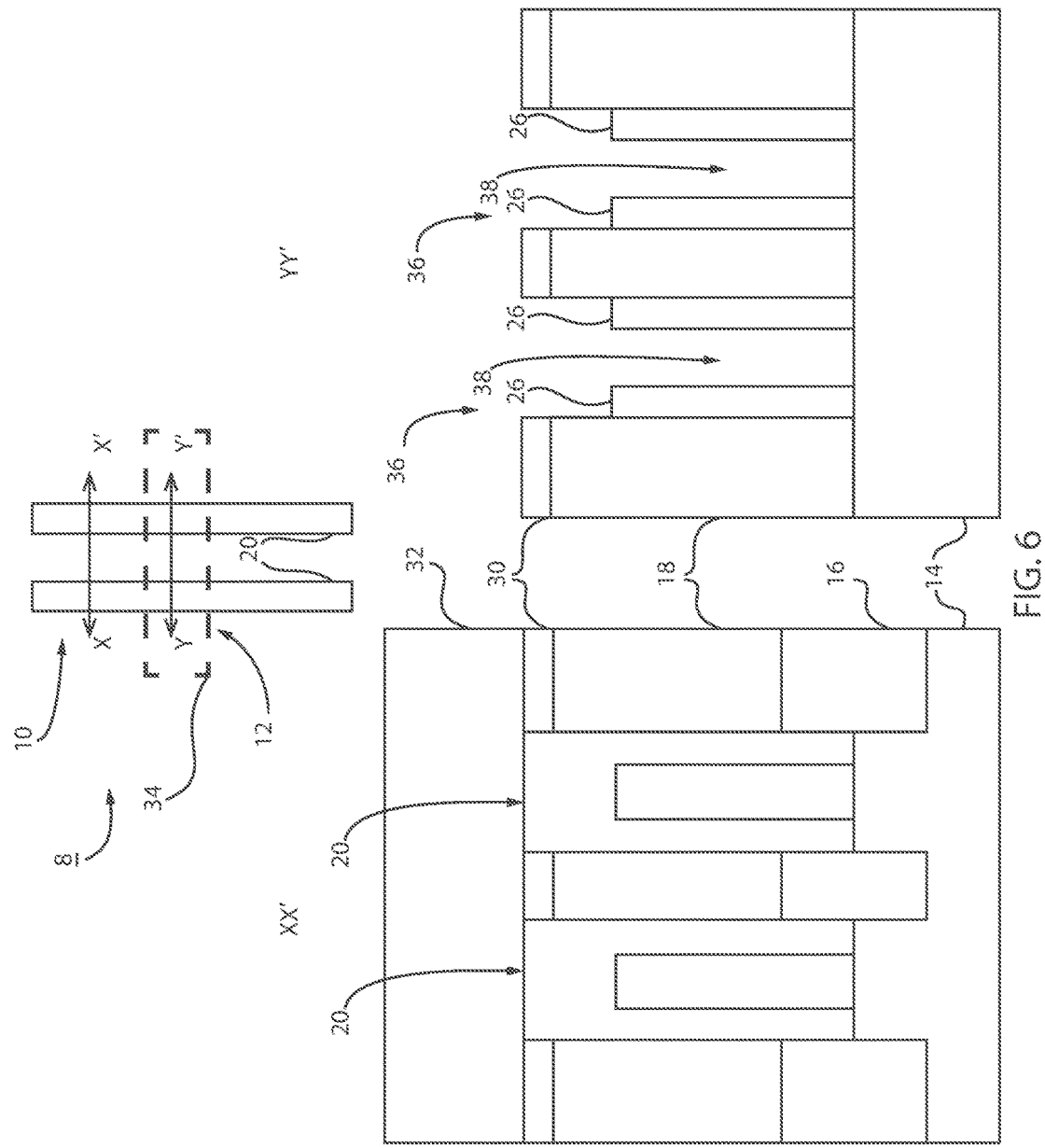
FIG. 6 is a cross-sectional view of the semiconductor device of FIG. 5 showing a schematic top view and two cross-sectional views depicting gate material removed from the gate structures in the cut region in accordance with the present principles.

Referring to FIG. 6, another etch process is performed to open up trenches 38. The gate material 24, in one embodiment, includes polysilicon or amorphous silicon. The gate material 24 is etched selectively relative to the spacers 26, the flowable dielectric 18 and the liner 30. The polysilicon etch selectivity to the material of the liner 30 is high, especially if the liner 30 includes TiN. The polysilicon gate material 24 is removed from the gate structure 20 to ensure that no residual polysilicon material remains. This material may provide undesirable conductive paths if not properly removed.

Figure 7:
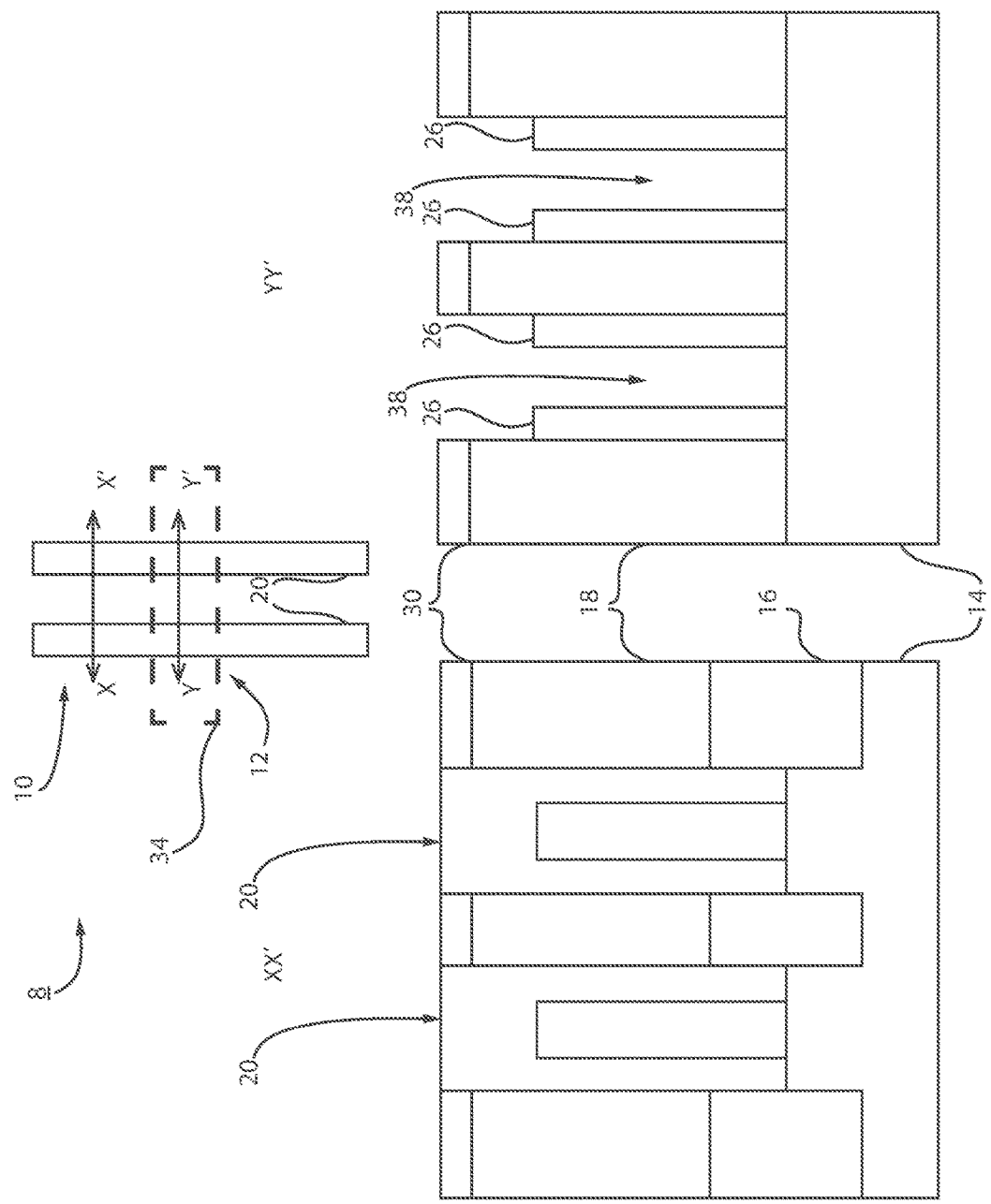
FIG. 7 is a cross-sectional view of the semiconductor device of FIG. 6 showing a schematic top view and two cross-sectional views depicting a mask layer (e.g., OPL) removed in accordance with the present principles.

Referring to FIG. 7, the OPL 32 is stripped off exposing the gate structures 20 in the PC region 10. The liner 30 is maintained to assist in the removal of the OPL 32 and assist in preserving the flowable dielectric 18. The liner 30 will also assist in the planarizing steps as will be described with reference to FIG. 8.

Figure 8:
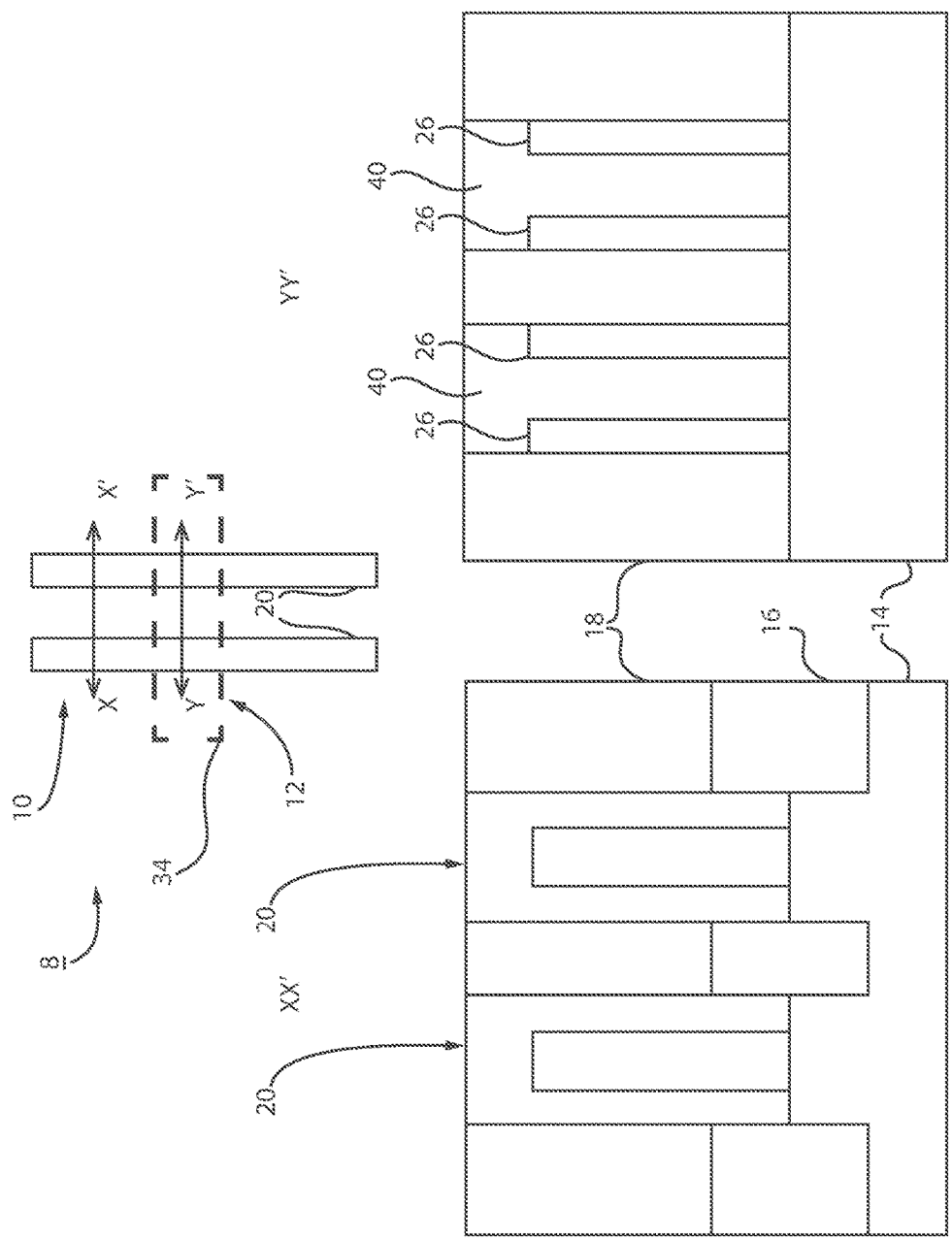
FIG. 8 is a cross-sectional view of the semiconductor device of FIG. 7 showing a schematic top view and two cross-sectional views depicting a gap fill dielectric formed in the gate structures of the cut region in accordance with the present principles.

Referring to FIG. 8, a dielectric gap fill is performed to form a dielectric material 40 in the recesses 36 and trenches 38. The dielectric material 40 is deposited over the surface of the liner 30, then a CMP process or other planarizing process is performed to remove the dielectric material 40 from a top surface of the device and to remove remaining portions of the liner 30. The dielectric material 40 may include silicon oxide, silicon nitride or other suitable dielectric fill material. Processing then can continue using know techniques.

The dielectric gap fill material 40 ensures that conductive material is removed from the gate structure 20 in the cut region 12. It should be understood that the cut region may be at a gate end or may be between device regions 10. By ensuring that the oxide (dielectric fill 18) thickness and integrity is maintained, later formed silicide regions and contact materials in the nearby device region can be better formed to prevent shorting or other issues.

Figure 9:
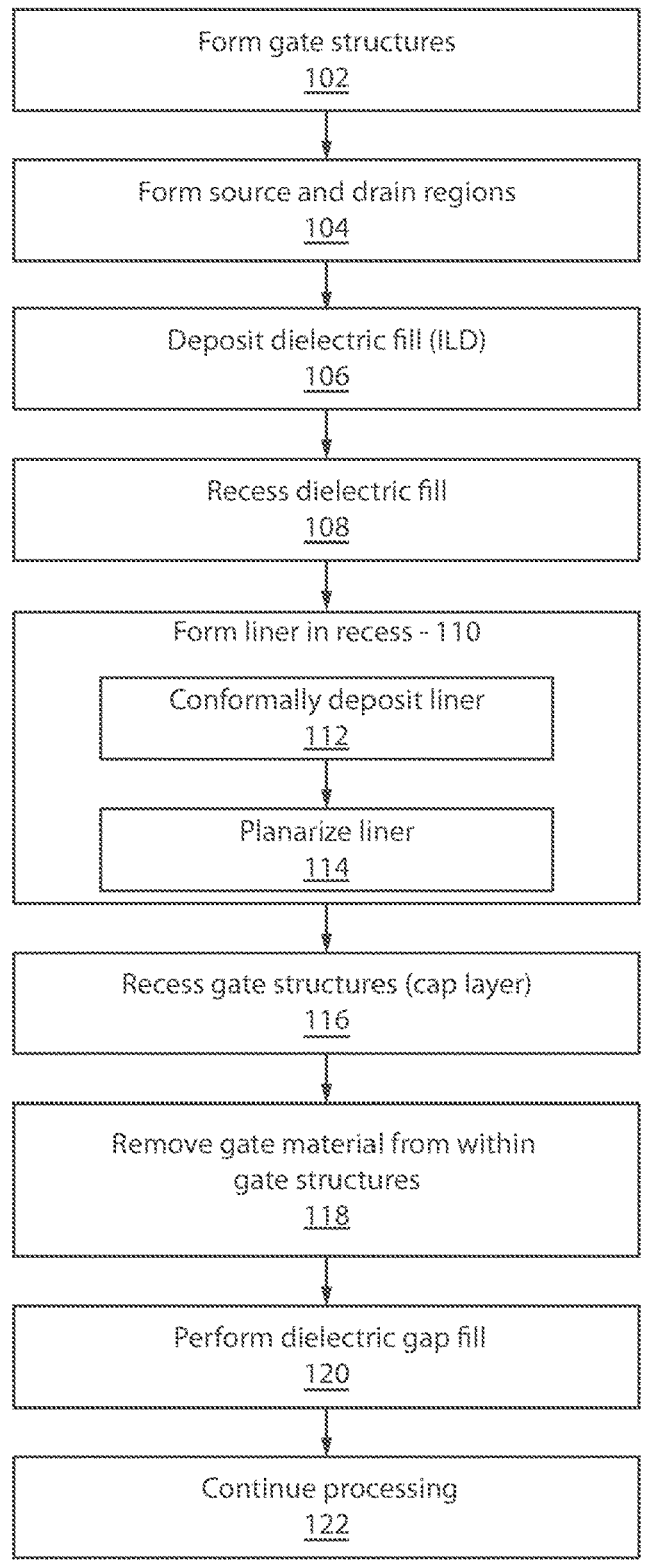
FIG. 9 is a block/flow diagram showing methods for preserving interlevel dielectric in a cut region in accordance with illustrative embodiments.

Referring to FIG. 9, methods for preserving interlevel dielectric in a cut region are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, gate structures are formed in a device region and a cut region. The gate structures may include dummy gate structures or gate-first gate structures. The gate structures may include a gate material, a cap layer and spacers (sidewalls). In block 104, source and drain regions are formed in the device region. This may include epitaxially growing the source and drain regions from a substrate although other structures, processes and configurations may be employed. In block 106, a dielectric fill is deposited and planarized to fill in gaps between gate structures in the device region and the cut region. This dielectric fill forms at least a portion of the ILD. In block 108, the dielectric fill is recessed to expose a cap layer at a top portion of the gate structures.

In block 110, a liner is formed in the recess on top of the recessed dielectric fill. The liner includes a material to provide etch selectivity to protect the dielectric fill. The liner may include TiN, TaN, $Al_2O_3$, etc. The liner material is conductive in some embodiments. The liner preferably includes a material that resists both silicon (gate material) and nitride (cap layer) etching to improve selectivity and protect the dielectric fill material (ILD).

In block 112, the liner is conformally deposited over the gate structures and on the top of the recessed dielectric fill. In block 114, the liner is planarized to remove the liner over the gate structures.

In block 116, the gate structures are recessed in the cut region to form a gate recess using the liner to protect the dielectric fill from being etched. This may include patterning a mask layer to protect the device region and etching the cap layer of the gate structure in the cut region.

In block 118, a gate material is removed from within the gate structure using the liner to protect the dielectric fill from being etched. The gate material may include material from one of a dummy gate or a gate first structure.

In block 120, a dielectric gap fill is formed to replace the gate material and to fill the gate recess in the cut region. This may include depositing the dielectric gap fill and planarizing the dielectric gap fill to remove the dielectric gap fill from a surface of the dielectric fill and to remove the liner. The dielectric gap fill may include forming the dielectric gap fill between spacers formed in the gate structure. In block 122, processing continues to complete the device.

Having described preferred embodiments for a gate cut with high selectivity to preserve interlevel dielectric layer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for preserving interlevel dielectric in a gate cut region, comprising:
forming a liner in a recess on top of a recessed dielectric fill recessed below a top surface of gate structures in a device region and in a cut region, the liner including a material to provide etch selectivity to protect the recessed dielectric fill,
wherein forming the liner includes:
conformally depositing the liner over the gate structures and on the top of the recessed dielectric fill, and
planarizing the liner to remove the liner over the gate structures; and
forming a dielectric gap fill to replace a gate material and to fill a gate recess in the cut region using the liner to protect the recessed dielectric fill from being etched.

2. The method as recited in claim 1, wherein forming the liner includes: forming the liner from a material that resists etching during recessing the cap layer and removing the gate material.

3. The method as recited in claim 1, wherein forming the liner includes: forming the liner from TiN.

4. The method as recited in claim 1, further including recessing the gate structures in the cut region by patterning a mask layer to protect the device region and etching a cap layer of the gate structure in the cut region.

5. The method as recited in claim 1, further including removing the gate material by removing a dummy gate.

6. The method as recited in claim 1, further including removing the gate material by removing a gate first structure.

7. The method as recited in claim 1, wherein forming the dielectric gap fill includes forming the dielectric gap fill between spacers formed in the gate structure.

8. The method as recited in claim 1, further comprising:
forming gate structures in the device region and the cut region; and
forming source and drain regions in the device region.

9. The method as recited in claim 8, wherein forming the source and drain regions in the device region includes epitaxially growing the source and drain regions between the gate structures.

10. The method as recited in claim 1, further comprising:
depositing and planarizing a dielectric fill to fill in gaps between the gate structures in the device region and the cut region; and
recessing the dielectric fill to form the recessed dielectric fill and to expose a cap layer at a top portion f the gate structures.

11. A method for preserving interlevel dielectric in a gate cut region, comprising:
forming a liner in a device region and in a cut region between gate structures such that the liner is below a top surface of the gate structures, and the liner including a material to provide etch selectivity to protect a recessed dielectric fill; and
recessing the gate structures and removing gate material in the cut region to form a gate recess using the liner to protect the recessed dielectric fill from being etched, wherein recessing the gate structures in the cut region includes patterning a mask layer to protect the device region and etching a cap layer of the gate structure in the cut region.

12. The method as recited in claim 11, wherein forming the liner includes:
conformally depositing the liner over the gate structures and on the top of the dielectric fill; and
planarizing the liner to remove the liner over the gate structures.

13. The method as recited in claim 11, wherein forming the liner includes: forming the liner from TiN.

14. The method as recited in claim 11, Wherein removing the gate material includes removing a dummy gate.

15. The method as recited in claim 11, wherein removing the gate material includes removing a gate first structure.

16. The method as recited in claim 11, further including forming the dielectric gap fill between spacers formed in the gate structure.

17. The method as recited in claim 11, further comprising:
forming gate structures in the device region and the cut region; and
forming source and drain regions in the device region.

18. The method as recited in claim 11, further comprising:
depositing and planarizing a dielectric fill to fill in gaps between the gate structures in the device region and the cut region; and
recessing the dielectric fill to form the recessed dielectric fill and to expose a cap layer at a top portion of the gate structures.

* * * * *